United States Patent
Hsieh

(10) Patent No.: US 11,675,013 B2
(45) Date of Patent: Jun. 13, 2023

(54) CLASSIFICATION METHOD AND SYSTEM FOR RECHARGEABLE BATTERIES

(71) Applicant: TAIWAN TRUEWIN TECHNOLOGY CO., LTD., Hsinchu (TW)

(72) Inventor: Fang-Chi Hsieh, Hsinchu (TW)

(73) Assignee: TAIWAN TRUEWIN TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 17/451,236

(22) Filed: Oct. 18, 2021

(65) Prior Publication Data

US 2023/0119619 A1  Apr. 20, 2023

(51) Int. Cl.
*G01R 31/00* (2006.01)
*G01R 31/367* (2019.01)
*G01R 31/396* (2019.01)
*G01R 31/387* (2019.01)
*G01R 31/379* (2019.01)

(52) U.S. Cl.
CPC ......... *G01R 31/367* (2019.01); *G01R 31/379* (2019.01); *G01R 31/387* (2019.01); *G01R 31/396* (2019.01)

(58) Field of Classification Search
USPC .......................................... 324/426, 432–435
See application file for complete search history.

(56) References Cited

U.S. PATENT DOCUMENTS

| | | | | |
|---|---|---|---|---|
| 2007/0267997 | A1* | 11/2007 | Kanazawa | H02J 7/16 180/68.5 |
| 2012/0098489 | A1* | 4/2012 | Arai | B60L 53/14 320/109 |
| 2013/0193931 | A1* | 8/2013 | Bornhoft | H02J 7/00712 320/160 |
| 2019/0178946 | A1 | 6/2019 | Han et al. | |
| 2020/0046021 | A1* | 2/2020 | Sur | H01M 10/46 |

* cited by examiner

*Primary Examiner* — Vincent Q Nguyen
(74) *Attorney, Agent, or Firm* — Hauptman Ham, LLP

(57) ABSTRACT

The present invention provides a classification method and system for rechargeable batteries based on stable charging current or current leakage. A charging current should be zero theoretically when a rechargeable battery is fully charged, however, due to self-discharging effect, there exists a current leakage even after the battery is fully charged. Rechargeable batteries can be classified based on their stable charging current after being fully charged. Different classified rechargeable batteries can be adopted for different purposes.

20 Claims, 3 Drawing Sheets

CLASSIFICATION METHOD AND SYSTEM FOR RECHARGEABLE BATTERIES

BACKGROUND

Technical Field

The present invention relates to a classification method and a system for rechargeable batteries, especially related to a classification method and system based on the size of a stable charging current of the rechargeable batteries after being fully charged.

Description of Related Art

US20190178946A1 disclosed a battery classification method and system. The method includes obtaining circulatory charge and discharge data of a battery pack to be classified, extracting a characteristic data set of the battery pack from the charge and discharge data; reducing the characteristic data set with rough set theory to obtain a reduced characteristic data set of the battery pack; and classifying single batteries of the battery pack according to the reduced characteristic data set with fuzzy clustering algorithm. The battery classification method and system provided by embodiments of the present disclosure can be applied to the retired power batteries, and improves the efficiency of classifying the retired power batteries.

This prior art reveals a complex classification method that collects multiple data information, and then uses a fuzzy clustering algorithm to classify batteries.

The present invention firstly discloses a simpler and automated classification method and system for classifying rechargeable batteries based on a stable charging current after the rechargeable batteries are fully charged.

DETAILED DESCRIPTION OF THE INVENTION

The present invention disclosed that the rechargeable batteries can be classified before leaving the factory. When the rechargeable batteries are fully charged, a stable charging currents can be detected for each rechargeable battery, which equals to a current leakage for respective rechargeable battery. The stable charging current is examined as a basis for classification.

The present invention uses lithium-ion rechargeable batteries as an example. Fifteen rechargeable batteries are prepared and charged with a constant voltage of 3.50V and a current limiting of 1.5 A, "time verse charging current" are recorded for review. After observation, two typical examples of 149 # and 150 # from the fifteen samples are illustrated, as shown in Table 1 and Table 2 below.

Figure 1:
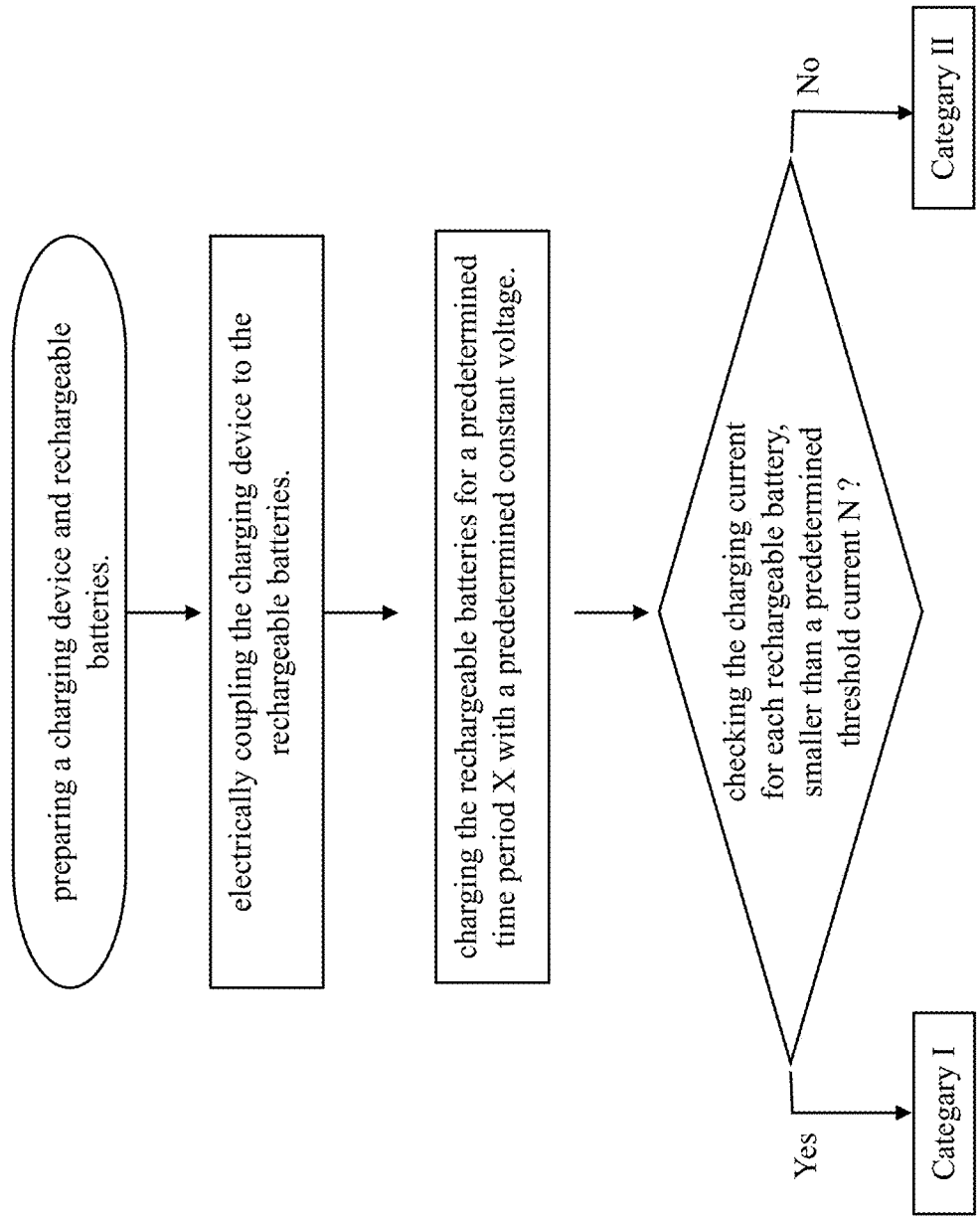
FIG. 1 shows a flow chart of a classification method according to the present invention.

FIG. 1 shows a flow chart of a classification method according to the present invention.

FIG. 1 shows that rechargeable batteries are classified based on their stable current leakage after being fully charged, the method includes the following steps:

(1) preparing a charging device and rechargeable batteries;
(2) electrically coupling the charging device to the rechargeable batteries;
(3) charging the rechargeable batteries for a predetermined time period X with a predetermined constant voltage;
(4) checking the stable charging current, smaller than a predetermined threshold current N?
(5) if yes, the rechargeable battery is categorized as category I; if no, the rechargeable battery is categorized as category II Table 1 shows an experimental data for the rechargeable battery 149 #according to the present invention.

TABLE 1

| 149# | |
|---|---|
| Time | Charging Current (mA) |
| 10:47 | 138 |
| 10:52 | 105 |
| 11:03 | 92 |
| 11:17 | 85 |
| 11:34 | 81 |
| 11:55 | 78 |
| 12:05 | 76 |
| 12:20 | 74 |
| 12:33 | 74 |
| 12:57 | 73 |
| 13:40 | 72 |
| 14:00 | 72 |

Table 1 shows that at 10:47, the charging current is 138 mA. As the charging time increases, the charging current gradually decreases; at 13:40, the charging current drops to 72 mA; at 14:00, the charging current is still around 72 mA. Apparently, the stable charging current for the rechargeable battery 149 #is around 72 mA or smaller.

Table 2 shows an experimental data for the rechargeable battery 150 #according to the present invention.

TABLE 2

| 150# | |
|---|---|
| Time | Charging Current (mA) |
| 14:43 | 310 |
| 14:45 | 121 |
| 14:46 | 95 |
| 14:47 | 67 |
| 14:48 | 46 |
| 14:49 | 31 |
| 14:50 | 23 |
| 14:51 | 17 |
| 14:52 | 13 |
| 14:54 | 8 |

Table 2 shows that at 10:43, the charging current is 310 mA. As the charging time increases, the charging current gradually decreases; at 14:50, the charging current drops to 23 mA; at 14:54, the charging current further drops to 8 mA; the charging current is rapidly reduced from 310 mA to 8 mA within only 11 minutes. Apparently, the stable charging current of this rechargeable battery is around 8 mA or smaller.

Figure 2:
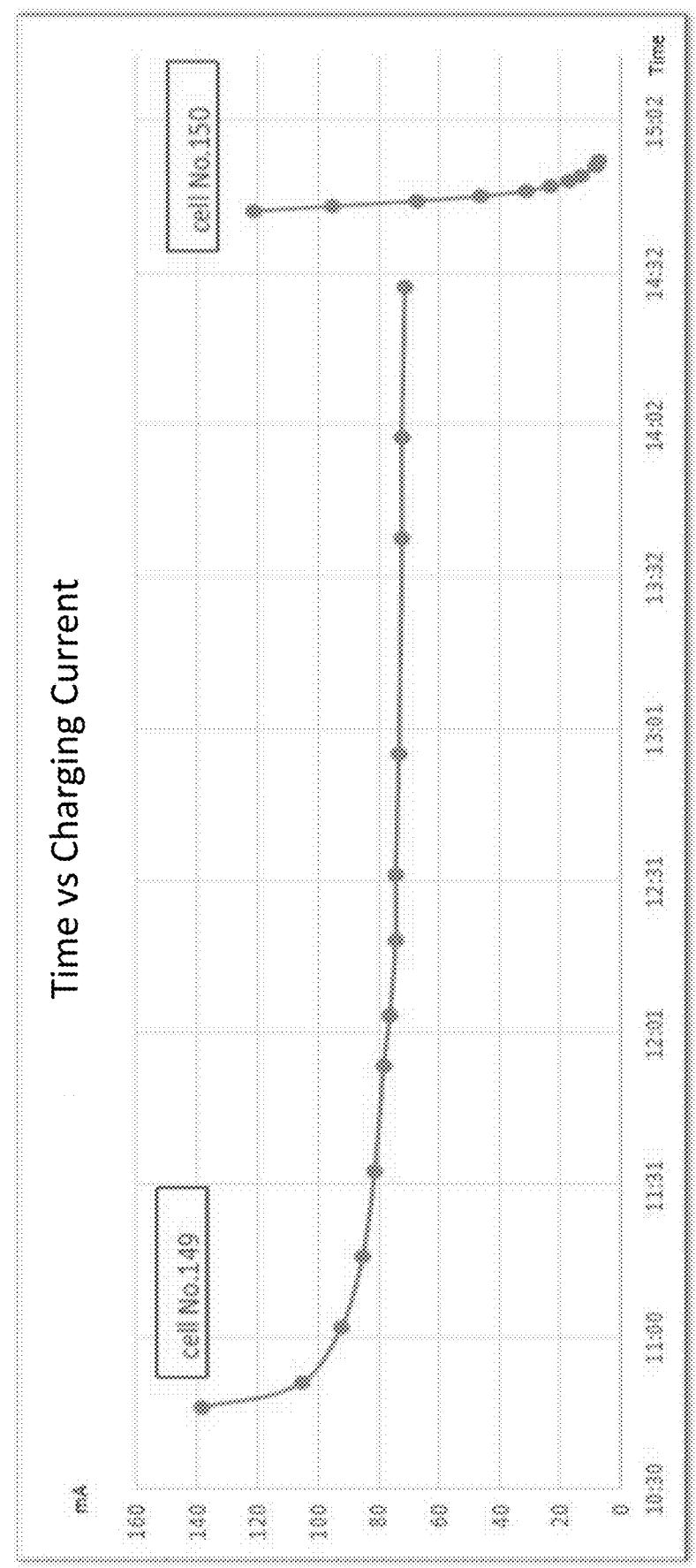
FIG. 2 shows a plot of "time versus charging current" for two typical examples according to the present invention.

FIG. 2 shows a plot of "time versus charging current" for two typical examples according to the present invention.

The curve on the left side of FIG. 2 shows that the charging current for the rechargeable battery 149 #tends to stabilize around 72 mA after being charged for about 4 hours.

The curve on the right side of FIG. 2 shows that the charging current of the rechargeable battery 150 #dropped to around 8 mA or smaller after being charged for 11 minutes.

The stable charging current for rechargeable battery 149 #and 150 #is around 72 mA and 8 mA respectively. Apparently, they are with different quality and hence we are able to use the stable charging current as the basis for battery classification according to the present invention.

For example: For the stable charging current, we set a threshold current in advance for categorization, such as 40 mA; then, the rechargeable battery 149 #, which has a stable charging current around 72 mA larger than 40 mA, can be classified as category I. The rechargeable battery 150 #, which has a stable charging current around 8 mA smaller than 40 mA, can be classified as category II.

Figure 3:
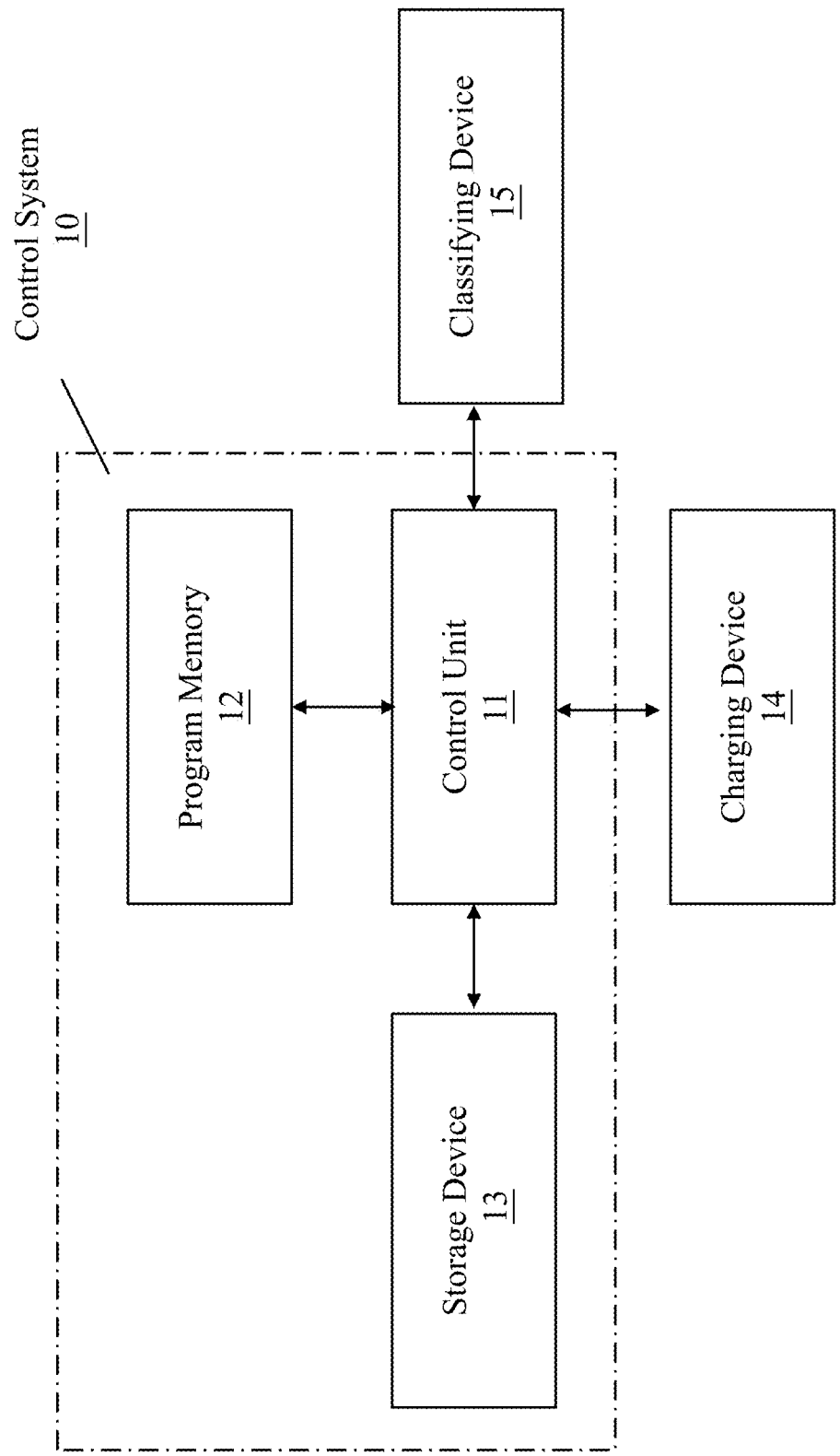
FIG. 3 shows a classification system according to the present invention.

FIG. 3 shows a classification system according to the present invention.

FIG. 3 shows a classification system according to the present invention includes: a control system 10 is electrically coupled to both a charging device 14 and a classifying device 15; wherein, the control system 10 further includes a control unit 11, a program memory 12, and a storage device 13. The control system 10 operates according to a program stored in the program memory 12. The control unit 11 instructs the charging device 14 to charge the rechargeable batteries with a predetermined constant voltage. The control unit 11 operates according to the program stored in the program memory 12 to check the charging current of each of the rechargeable batteries; when the charging current reaches a stable condition, the classifying device 15 is instructed to classify the rechargeable batteries as one of a predetermined categories; the information obtained from the classifying process is stored in the storage device 13 for subsequent purposes including statistics, printing and/or output; the program instructs the control unit 11 to perform the classifying process includes the following steps:

(1) charging the rechargeable batteries for a predetermined time period X with a predetermined constant voltage;
(2) checking the stable charging current, smaller than a predetermined threshold current N?
(3) if yes, the rechargeable battery is categorized as category I; if no, the rechargeable battery is categorized as category II The foregoing experiment was performed on lithium-ion rechargeable batteries as an example only, and the charging voltage was set to 3.50V, charging time period can be vary depending on different conditions. For fast test, three to five minutes can be enough, for normal test 10 minutes may be enough. Similarly, we can also classify lead-acid batteries in the same way, the charging voltage is set to be 13.5V when classifying lead-acid batteries.

While several embodiments have been described by way of example, it will be apparent to those skilled in the art that various modifications may be configured without departs from the spirit of the present invention. Such modifications are all within the scope of the present invention, as defined by the appended claims.

NUMERICAL SYSTEM

149 #: lithium-ion rechargeable battery
150 #: lithium-ion rechargeable battery
10: Control system
11: Control unit
12: Program memory
13: Storage device
14: Charging device
15: Classifying device

What is claimed is:

1. A classification method for rechargeable batteries, the method comprising:
electrically coupling a charging device to a rechargeable battery which is fully charged;
charging the fully charged rechargeable battery for a predetermined time period at a predetermined constant voltage;
comparing a stable charging current of the rechargeable battery in said charging with a predetermined threshold current;
in response to the stable charging current of the rechargeable battery being smaller than the predetermined threshold current, classifying the rechargeable battery into a first category; and
in response to the stable charging current of the rechargeable battery being not smaller than the predetermined threshold current, classifying the rechargeable battery into a second category.

2. The classification method as claimed in claim 1, wherein the rechargeable batteries are lithium-ion rechargeable batteries, and the predetermined constant voltage for said charging is 3.50V.

3. The classification method as claimed in claim 2, wherein the predetermined time period for said charging is from 3 to 5 minutes.

4. The classification method as claimed in claim 2, wherein the predetermined threshold current is 40 mA.

5. The classification method as claimed in claim 1, wherein the rechargeable batteries are lead-acid batteries, and the predetermined constant voltage for said charging is 13.50V.

6. The classification method as claimed in claim 1, wherein the method is performed before the rechargeable battery leaves a factory.

7. The classification method as claimed in claim 6, wherein the stable charging current equals to a current leakage of the rechargeable battery after the rechargeable battery is fully charged.

8. The classification method as claimed in claim 7, wherein
the rechargeable batteries are lithium-ion rechargeable batteries,
the predetermined constant voltage for said charging is 3.50V,
the predetermined time period for said charging is from 3 to 5 minutes, and
the predetermined threshold current is 40 mA.

9. The classification method as claimed in claim 1, wherein the stable charging current equals to a current leakage of the rechargeable battery after the rechargeable battery is fully charged.

10. The classification method as claimed in claim 9, wherein
the rechargeable batteries are lithium-ion rechargeable batteries,
the predetermined constant voltage for said charging is 3.50V,
the predetermined time period for said charging is from 3 to 5 minutes, and
the predetermined threshold current is 40 mA.

11. A classification system for rechargeable batteries, the classification system comprising:
a charging device;
a classifying device;
a control unit; and a program memory storing a program which, when executed, instructs the control unit to perform a classification process including:
  instructing the charging device to perform charging of a fully charged rechargeable battery for a predetermined time period at a predetermined constant voltage;
  comparing a stable charging current of the rechargeable battery in said charging with a predetermined threshold current;
  in response to the stable charging current of the rechargeable battery being smaller than the predetermined threshold current, instructing the classifying device to classify the rechargeable battery into a first category; and
  in response to the stable charging current of the rechargeable battery being not smaller than the predetermined threshold current, instructing the classifying device to classify the rechargeable battery into a second category.

12. The classification system as claimed in claim 11, wherein the rechargeable batteries are lithium-ion rechargeable batteries, and the predetermined constant voltage for said charging is 3.50V.

13. The classification system as claimed in claim 12, wherein the predetermined time period for said charging is from 3 to 5 minutes.

14. The classification system as claimed in claim 12, wherein the predetermined threshold current is 40 mA.

15. The classification system as claimed in claim 11, wherein the rechargeable batteries are lead-acid batteries, and the predetermined constant voltage for said charging is 13.50V.

16. The classification system as claimed in claim 11, wherein the classification system is configured to perform the classification process before the rechargeable battery leaves a factory.

17. The classification system as claimed in claim 16, wherein the stable charging current equals to a current leakage of the rechargeable battery after the rechargeable battery is fully charged.

18. The classification system as claimed in claim 17, wherein
  the rechargeable batteries are lithium-ion rechargeable batteries,
  the predetermined constant voltage for said charging is 3.50V,
  the predetermined time period for said charging is from 3 to 5 minutes, and
  the predetermined threshold current is 40 mA.

19. The classification system as claimed in claim 11, wherein the stable charging current equals to a current leakage of the rechargeable battery after the rechargeable battery is fully charged.

20. The classification system as claimed in claim 19, wherein
  the rechargeable batteries are lithium-ion rechargeable batteries,
  the predetermined constant voltage for said charging is 3.50V,
  the predetermined time period for said charging is from 3 to 5 minutes, and
  the predetermined threshold current is 40 mA.

* * * * *